(12) United States Patent
Wang

(10) Patent No.: US 12,490,582 B2
(45) Date of Patent: Dec. 2, 2025

(54) DISPLAY PANEL AND DISPLAY DEVICE

(71) Applicant: HEFEI VISIONOX TECHNOLOGY CO., LTD., Anhui (CN)

(72) Inventor: Jie Wang, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 525 days.

(21) Appl. No.: 17/986,304

(22) Filed: Nov. 14, 2022

(65) Prior Publication Data

US 2023/0071744 A1  Mar. 9, 2023

Related U.S. Application Data

(63) Continuation of application No. PCT/CN2021/108751, filed on Jul. 27, 2021.

(30) Foreign Application Priority Data

Oct. 30, 2020 (CN) .......................... 202011189761.8

(51) Int. Cl.
| | |
|---|---|
| H01L 51/52 | (2006.01) |
| H10D 86/40 | (2025.01) |
| H10D 86/60 | (2025.01) |
| H10K 50/844 | (2023.01) |

(Continued)

(52) U.S. Cl.
CPC ........... H10K 50/844 (2023.02); H10D 86/40 (2025.01); H10D 86/60 (2025.01); H10K 50/865 (2023.02); H10K 59/1213 (2023.02)

(58) Field of Classification Search
None
See application file for complete search history.

(56) References Cited

U.S. PATENT DOCUMENTS

2014/0339517 A1  11/2014  Park et al.
2020/0127216 A1*  4/2020  Tao .................... H10K 50/844

FOREIGN PATENT DOCUMENTS

| CN | 208045503 U | 11/2018 |
|---|---|---|
| CN | 109065552 A | 12/2018 |
| CN | 209249486 U | 8/2019 |

(Continued)

OTHER PUBLICATIONS

Office Action issued on Mar. 31, 2024, in corresponding Korean Application No. 10-2022-7040500, 17 pages.

(Continued)

*Primary Examiner* — William C Trapanese
(74) *Attorney, Agent, or Firm* — Maier & Maier, PLLC

(57) ABSTRACT

A display panel and a display device, and the display panel includes a pixel area, a drive area, and a non-display area surrounding the pixel area and the drive area in a direction parallel to a light emitting surface of the display panel; the non-display includes a substrate, a blocking layer, and an encapsulation layer, which are stacked with each other. There is further provided a blocking groove surrounding the drive area and the pixel area in the non-display area, and the blocking groove extends at least to the blocking layer in a thickness direction, so that a part of the blocking layer is exposed in the blocking groove, and meanwhile, an extension portion of the encapsulation layer at least covers a first side surface of the blocking groove close to the drive area, and connects with the blocking layer.

17 Claims, 2 Drawing Sheets

(51) Int. Cl.
*H10K 50/86* (2023.01)
*H10K 59/121* (2023.01)

(56) References Cited

FOREIGN PATENT DOCUMENTS

| | | |
|---|---|---|
| CN | 110391350 A | 10/2019 |
| CN | 110491920 A | 11/2019 |
| CN | 110518046 A | 11/2019 |
| CN | 110634928 A | 12/2019 |
| CN | 110880561 A | 3/2020 |
| CN | 111081732 A | 4/2020 |
| CN | 111430566 A | 7/2020 |
| CN | 112310320 A | 2/2021 |
| KR | 1020190058608 A | 5/2019 |
| KR | 1020190115166 A | 10/2019 |
| KR | 1020190141224 A | 12/2019 |

OTHER PUBLICATIONS

Office Action issued on Sep. 2, 2022, in connection with corresponding Chinese Application No. 202011189761.8 (4 pages with Partial English Translation).

Office Action issued on Feb. 16, 2022, in connection with corresponding Chinese Application No. 202011189761.8 (12 pp., including machine-generated English translation).

Office Action issued on Jun. 22, 2022, in connection with corresponding Chinese Application No. 202011189761.8 (10 pp., including machine-generated English translation).

International Search Report and Written Opinion issued on Nov. 1, 2021 in corresponding International Patent Application No. PCT/CN2021/108751; 14 pages.

* cited by examiner

DISPLAY PANEL AND DISPLAY DEVICE

CROSS-REFERENCE TO RELATED APPLICATION

The present application is a continuation of the International Application No. PCT/CN2021/108751, filed on Jul. 27, 2021, which claims priority to Chinese Patent Application No. 202011189761.8, filed on Oct. 30, 2020, both of which are hereby incorporated by reference in their entireties.

TECHNICAL FIELD

The present application relates to the technical field of display, in particular to a display panel and a display device.

BACKGROUND

The organic light-emitting diode (OLED, Organic Light-Emitting Diode) display panel has the characteristics of self-light emitting, high contrast, small thickness, high response speed, wide viewing angle, low power consumption, flexible display and the like, and thus is widely applied to display devices. With the continuous improvement and technology changes of high PPI (Pixels Per Inch) technology and high refresh technology in display filed, users have higher and higher demands for battery life of mobile terminal products.

In the technology of LTPO (Low Temperature Polycrystalline Oxide) panel, a LTPS (Low Temperature Poly-Silicon) device is usually formed on a substrate first, and then a IGZO (Indium Gallium Zinc Oxide) device is formed on the substrate, so that the display panel has the advantages of both low IGZO (Indium Gallium Zinc Oxide) electric leakage and high LTPS (Low Temperature Poly-Silicon) mobility, which enables a low-frequency display to be applied in small and medium-sized display panels, and greatly improves the battery life of the products.

However, in the manufacturing process of display panels, usually a display panel mother board with a larger size is produced first, then the display panel mother board is cut into a plurality of independent display panels by using a cutting device, and silicon oxide covered on the IGZO (Indium Gallium Zinc Oxide) device is exposed on side surfaces of the display panels. Therefore, for the display panels manufactured in the above manner, external water vapor or oxygen easily invades into display areas from the side surfaces of the display panels, thereby affecting the displaying of the display panels.

SUMMARY

In view of the above problems, embodiments of the present application provide a display panel and a display device, which are used to prevent water vapor or oxygen from invading into the display panel and ensure the displaying of the display panel.

In order to achieve the above objects, a first aspect of the embodiments of the present application provides a display panel, which is provided with a pixel area, a drive area and a non-display area, and the non-display area surrounds the pixel area and the drive area in a direction parallel to a light emitting surface of the display panel; the display panel includes a substrate, a blocking layer, and an encapsulation layer, which are stacked with each other in the non-display area; and a blocking groove located in the non-display area, the blocking groove surrounds the pixel area and the drive area in a direction parallel to the light emitting surface of the display panel, and the blocking groove extends at least to the blocking layer in a thickness direction; the encapsulation layer is provided with an extension portion, the extension portion at least covers a first side surface of the blocking groove close to the drive area, and the encapsulation layer and the blocking layer form a sealed space surrounding the pixel area and the drive area.

A second aspect of the embodiments of the present application provides a display device, which includes the above-mentioned display panel.

In the display panel and display device provided by the embodiments of the present application, the non-display area is provided with a blocking groove surrounding the drive area and the pixel area in a direction parallel to a light emitting surface of the display panel, and the blocking groove extends at least to the blocking layer in the thickness direction, so that a part of the blocking layer is exposed in the blocking groove, and meanwhile, an extension portion of an encapsulation layer at least covers a first side surface of the blocking groove close to the drive area, and connects with the blocking layer, so that the encapsulation layer and the blocking layer form a sealed space for surrounding the pixel area and the drive area. When external water vapor or oxygen invades from the side surface of the display panel, water vapor or oxygen can be blocked by the blocking layer and the extension portion located on the first side surface, thereby preventing transmission of the water vapor or oxygen to the drive area and the pixel area, and ensuring the displaying of the display panel.

DETAILED DESCRIPTION OF THE EMBODIMENTS

An encapsulation layer is usually an uppermost film layer of the display panel and is used for preventing water vapor or oxygen from entering the drive area and the pixel area. When a plurality of independent display panels are formed by cutting a display panel mother board using a cutting device, the encapsulation layer cannot cover side surfaces of the display panels, so that silicon oxide in the display panel is exposed outside. As a result, external water vapor or oxygen can easily enter the drive area and the pixel area from the side surfaces of the display panels, affecting the displaying of the display panels.

In view of the above technical problem, embodiments of the present application provide a display panel and a display device, where a blocking groove surrounding a drive area and a pixel area in a direction parallel to a light emitting surface of the display panel is provided within a non-display area, with the blocking groove extending at least to a blocking layer in a thickness direction, so that a part of the blocking layer is exposed in the blocking groove, and at the same time, an extension portion of the encapsulation layer covers at least a first side surface of the blocking groove close to the drive area, so that the encapsulation layer and the blocking layer form a sealed space, and the sealed space is used to surround the driving are and the pixel area. When external water vapor or oxygen invades from the side surface of the display panel, water vapor or oxygen can be blocked by the blocking layer and the extension portion located on the first side surface, thereby preventing the water vapor or oxygen from being transmitted to the drive area and the pixel area, and ensuring the displaying of the display panel.

In order to make the above objects, features and advantages of the embodiments of the present application more comprehensible, the technical solutions in the embodiments of the present application are clearly and completely described below with reference to the accompanying drawings of the present application.

Figure 1:
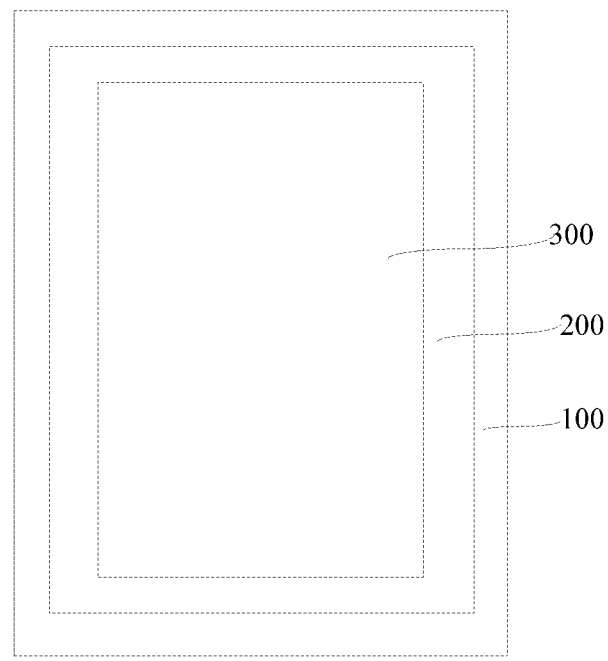
FIG. 1 is a schematic structural diagram of a display panel according to an embodiment of the present application.

As shown in FIG. 1, a display panel provided by an embodiment of the present application includes a pixel are 300, a drive area 200, and a non-display area 100. The non-display area 100 surrounds the pixel area 300 and the drive area 200 in a direction parallel to a light emitting surface of the display panel, where the pixel area 300 is disposed on a side of the drive area 200 away from the non-display area 100. In addition, the term "surround" as used in the embodiment of the present application may be understood as semi-surrounding, that is, the non-display area 100 may be relatively disposed on both sides of the drive area 200, or the term "surround" may be understood as completely surrounding, that is, the non-display area 100 is disposed around the drive area 200.

Figure 2:
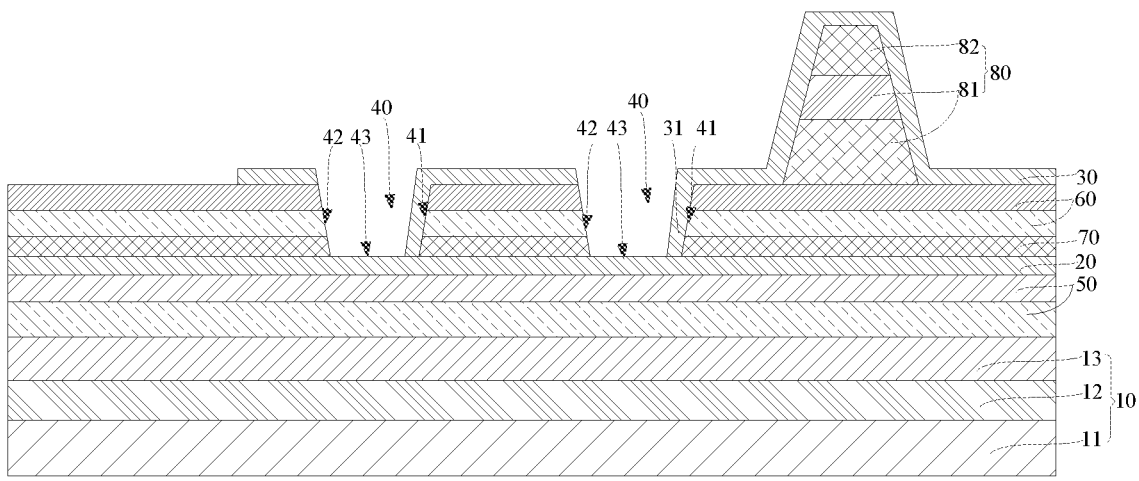
FIG. 2 is a schematic cross-sectional view of a display panel according to an embodiment of the present application.

As shown in FIG. 2, the non-display area 100 includes a substrate 10, a blocking layer 20 and an encapsulation layer 30, which are stacked with each other. The substrate 10 serves as a support component of the display panel and is used for supporting devices arranged thereon. The substrate 10 may be a flexible substrate, such as a flexible substrate including polyimide (PI, Polyimide). However, the substrate is not limited to the material described above.

For example, as shown in FIG. 2, the substrate 10 may also include a first flexible substrate 11, a silicon oxide layer 12 and a second flexible substrate 13 that are sequentially stacked, and then flexibility of the substrate 10 can be ensured and meanwhile the supporting force of the substrate 10 can be enhanced by the silicon oxide layer 12.

The blocking layer 20 is disposed on the substrate 10, and the material of the blocking layer 20 can be silicon nitride. Silicon nitride has both insulating property and strong ability of blocking water vapor or oxygen. Therefore, in the present embodiment, the blocking layer 20 is used to block water vapor or oxygen in an external environment, thereby preventing water vapor or oxygen from diffusing into the pixel area 300 and the drive area 200, and ensuring the displaying of the display panel.

It can be understood that the blocking layer 20 can be arranged in the same layer as the silicon nitride located on the lowermost layer of the TFT (Thin Film Transistor) array substrate in the pixel area, so that when water vapor or oxygen invades from the side surface of the display panel and when water vapor or oxygen is diffused to the blocking layer 20 in a direction perpendicular to the substrate 10, the blocking layer 20 blocks water vapor or oxygen and makes them blocked between the substrate 10 and the blocking layer 20, preventing water vapor or oxygen from diffusing into the drive area 200 and the pixel area 300 located above the blocking layer 20, and ensuring the displaying of the display panel.

In order to prevent water vapor or oxygen from entering the drive area 200 and the pixel area 300 from the top of the display panel, the display panel usually further includes an encapsulation layer 30. The encapsulation layer 30 covers the drive area 200 and the pixel area 300, and is used for realizing isolation of the drive area 200 and the pixel area 300 from the external environment, preventing water vapor or oxygen from entering the drive area 200 and the pixel area 300 to affect the displaying of the display panel.

The encapsulation layer 30 may be an inorganic film or an organic film, where the inorganic film may be a ceramic film, such as a silicon nitride film. In addition, the organic film may be a polymer film, and may be formed by two or more polymer films stacked with each other.

In the present embodiment, the non-display area 100 is provided with a blocking groove 40 surrounding the drive area 200 and the pixel area 300 in a direction parallel to the light emitting surface of the display panel, and the blocking groove 40 extends at least to the blocking layer 20 in the thickness direction, so that a part of the blocking layer 20 is exposed in the blocking groove 40. At the same time, the encapsulation layer 30 has an extension portion 31, the extension portion 31 covers at least a first side surface 41 of the blocking groove 40 close to the drive area. The extension portion 31 is connected to the blocking layer 20, so that the encapsulation layer 30 and the blocking layer 20 form a sealed space, and the sealed space is used to surround the drive area 200 and the pixel area 300.

Figure 3:
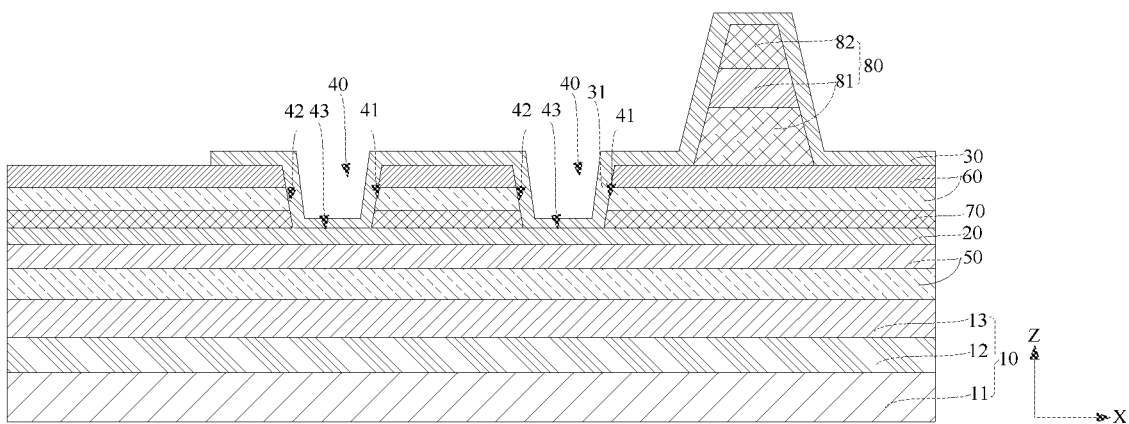
FIG. 3 is another schematic cross-sectional view of a display panel according to an embodiment of the present application.

It should be noted that, when a plane parallel to the substrate is taken as a cross-section, the cross section of the blocking groove 40 may be circular or square, and taking the orientation shown in FIG. 2 as an example, an area enclosed by an edge of the left side surface of the blocking groove 40 away from the substrate is used to dispose the pixel area 300 and the drive area 200, and the thickness direction is a direction from the substrate to the encapsulation layer, i.e., Z direction in FIG. 3.

When external water vapor or oxygen invades from the side surface of the display panel, a portion of water vapor or oxygen located below the blocking layer 20 is blocked by the blocking layer 20 and is blocked between the substrate 10 and the blocking layer 20, preventing water vapor from diffusing into the pixel area 300 and the drive area 200 located above the blocking layer 20, and ensuring the displaying of the display panel.

A portion of water vapor or oxygen located above the blocking layer 20 will touch the extension portion 31 on the first side surface 41 when diffusing in a horizontal direction, and the extension portion 31 can block the water vapor or oxygen so as to make it located between the edge of the display panel and the blocking groove 40, thereby preventing water vapor or oxygen from being transmitted to the pixel area 300 and the drive area 200, and ensuring the displaying of the display panel.

Further, in order to improve the capability of blocking water vapor or oxygen of the blocking layer 20, a material of the blocking layer 20 and a material of the encapsulation layer 30 may be the same or different. When the material of the blocking layer 20 and the material of the encapsulation layer 30 are the same, the material of both the blocking layer 20 and the encapsulation layer 30 may be silicon nitride, or the material of both the blocking layer 20 and the encapsulation layer 30 is silicon oxynitride; and when the material of blocking layer 20 is different from the material of the encapsulation layer 30, the material of the blocking layer 20 may be silicon nitride, and the material of the encapsulation layer 30 may be silicon oxynitride, and the blocking layer 20 is connected to the encapsulation layer 30 by N—N bonds.

In some embodiments, as shown in FIG. 3, the extension portion 31 is further covered on a second side surface 42 of the blocking groove 40 away from the drive area 200 and also on a groove bottom 43 of the blocking groove 40.

When a plane perpendicular to the substrate 10 is taken as a longitudinal section, a shape of the longitudinal section of the extension portion 31 is U-shaped, a portion of water vapor or oxygen located above the blocking layer 20 will preferentially touch the extension portion 31 on the second side surface 42 when diffusing in the horizontal direction. The extension portion 31 can block water vapor or oxygen to make they blocked between the edge of the display panel and the second side surface 42. If there is still a small portion of water vapor or oxygen diffusing into the first side surface 41, the small portion of water vapor or oxygen is blocked by the extension portion 31 located on the first side surface 41. As a result, the ability of the extension portion 31 to block water vapor or oxygen is improved through double blocking of the extension portion 31 located on the first side surface 41 and the extension portion 31 located on the second side surface 42, thereby ensuring the displaying of the display panel.

Meanwhile, the groove bottom 43 of the blocking groove 40 is also covered with extension portion 31, which is equivalent to increasing the thickness of the blocking layer 20, thereby improving the capability of the blocking layer 20 to block water vapor or oxygen, and thus ensuring the displaying of the display panel.

It should be noted that a coverage area by the extension portion 31 is not limited to the area above. The extension portion 31 can only cover the second side surface 42 of the blocking groove 40 away from the drive area, or the extension portion 31 covers both the first side surface 41 and the second side surface 42 of the blocking groove 40.

In some embodiments, taking a plane perpendicular to the substrate 10 as a longitudinal section, a shape of the longitudinal section of the blocking groove 40 is trapezoidal, a size of a groove opening of the blocking groove 40 is larger than a size of a groove bottom of the blocking groove 40, that is, the blocking groove 40 is of a trapezoidal structure with a large upper and a smaller bottom. In other words, the longitudinal section of the blocking groove 40 is in an inverted trapezoid shape. This facilitates the manufacture of the blocking groove 40, and simplifies the manufacturing process of the blocking groove 40.

There may be a plurality of blocking grooves 40, and the plurality of blocking grooves 40 are arranged in the non-display area at intervals. In other words, the plurality of blocking grooves 40 can be arranged at intervals along a length direction of the display panel. In the present embodiment, by the arrangement of the plurality of blocking grooves 40, external water vapor or oxygen can be multiply blocked, preventing external water vapor or oxygen from diffusing into the pixel area 300 and the drive area 200, and ensuring normal displaying of the display panel.

It should be noted that the length direction of the display panel may be X direction in FIG. 3. In addition, distances between respective adjacent two blocking grooves 40 may be the same or different.

In the present embodiment, when an array substrate is formed in the pixel area 300 and the drive area 200, the blocking grooves 40 located in the non-display area 100 may be synchronously formed, thereby avoiding forming the blocking grooves 40 separately by using a manufacturing process, and simplifying manufacturing process and manufacturing cost of the display panel.

With continued reference to FIG. 3, the non-display area 100 further includes a first inorganic film layer 50 and a second inorganic film layer 60, where the first inorganic film layer 50 is disposed on one side of the substrate 10 close to the blocking layer 20, with the blocking layer 20 being disposed on a side of the first inorganic film layer 50 away from the substrate 10, and the second inorganic film layer 60 is disposed on a side of the blocking layer 20 away from the first inorganic film layer 50.

That is, the first inorganic film layer 50, the blocking layer 20, and the second inorganic film layer 60 are stacked with each other on the substrate 10.

As shown in FIG. 3, the blocking groove 40 passes through the second inorganic film layer 60 in the thickness direction and extends to the blocking layer 20, that is, the groove bottom 43 of the blocking groove 40 is located on the upper surface of the blocking layer 20, so as to increase a contact area between the extension portion 31 and the blocking layer 20, reduce the probability of diffusion of water vapor or oxygen, which intrudes from the side surfaces, into the pixel area 300 and the drive area 200, and thus ensure the displaying of the display panel.

Figure 4:
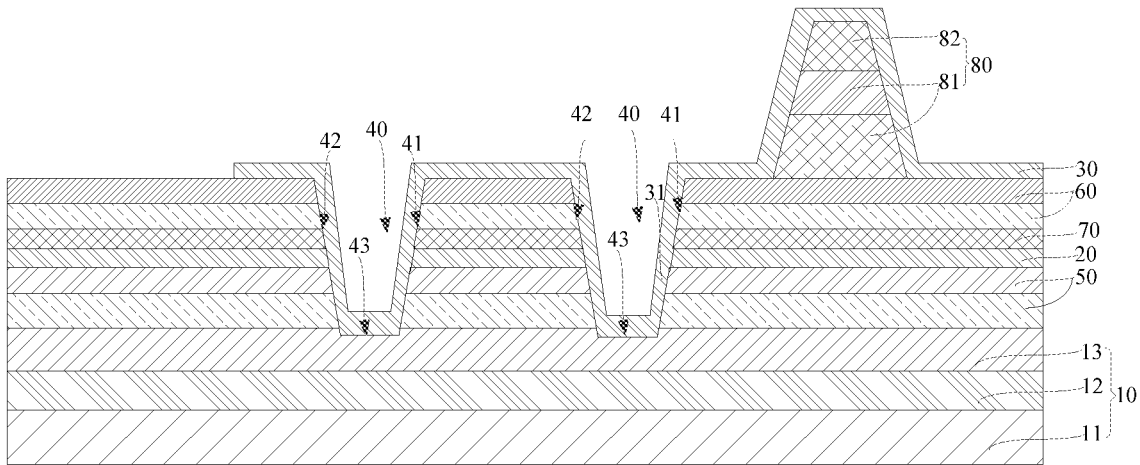
FIG. 4 is still another schematic cross-sectional view of a display panel according to an embodiment of the present application.

As shown in FIG. 4, the blocking groove 40 passes through the second inorganic film layer 60 and the blocking layer 20 in the thickness direction, and extends into the first inorganic film layer 50 or onto the substrate 10.

In other words, the groove bottom 43 of the blocking groove 40 may be located in the first inorganic film layer 50, or may be located on the substrate 10.

In the present embodiment, by the above arrangement, the depth of the blocking groove 40 can be increased to increase the length of the extension portion 31 covering the first side surface 41 and the second side surface 42, thereby reducing the probability of diffusion of water vapor or oxygen, which intrudes from the side surface, to the pixel area 300 and the drive area 200, and thus ensuring the displaying of the display panel.

In some embodiments, both the first inorganic film layer 50 and the second inorganic film layer 60 may be in a stacked structure, where the first inorganic film layer 50 may include a plurality of inorganic film sub-layers, and the materials of adjacent inorganic film sub-layers are different. For example, as shown in FIG. 3 and FIG. 4, the first inorganic film layer 50 provided in the present embodiment includes two inorganic film sub-layers, the material of the inorganic film sub-layer close to the substrate 10 may be silicon oxide, and the material of the inorganic film sub-layer away from the substrate 10 may be a composition of silicon oxide, silicon nitride, and monocrystalline silicon, so that the first inorganic film layer 50 also includes silicon nitride, and accordingly, the first inorganic film layer 50 also has the function of blocking water vapor or oxygen and provides a guarantee for normal displaying of the display panel.

When the blocking groove 40 extends to the first inorganic film layer 50 in the thickness direction, it can be understood that the groove bottom 43 of the blocking groove 40 is located in any one of the first inorganic film sub-layers.

In addition, the second inorganic film layer 60 includes a plurality of second inorganic film sub-layers stacked with each other, and the materials of adjacent second inorganic film sub-layer are different.

For example, as shown in FIG. 3 and FIG. 4, the second inorganic film layer 60 provided in the present embodiment includes two second inorganic film sub-layers, the material of the second inorganic film sub-layer close to the substrate 10 may be silicon oxide, and the material of the second inorganic film sub-layer away from the substrate 10 may be silicon nitride. In this way, on one hand, silicon nitride is also included in the second inorganic film layer 60, and accordingly, the second inorganic film layer 60 also has the function of blocking water vapor or oxygen and provides guarantee for normal displaying of the display panel. On the other hand, both the second inorganic film layer 60 and the encapsulation layer 30 are silicon nitride, which can improve a bonding force between the second inorganic film layer 60 and the encapsulation layer 30, thereby improving the ability of the encapsulation layer 30 to block water vapor or oxygen.

In some embodiments, a third inorganic film layer 70 is disposed between the second inorganic film layer 60 and the blocking layer 20, and the third inorganic film layer 70 is made of silicon nitride.

In the present embodiment, the second inorganic film layer 60, the blocking layer 20, and the first inorganic film layer 50 are all formed along with the array substrate in the display panel. The array substrate includes a switching thin film transistor and a driving thin film transistor. In order to achieve insulation between the switching thin film transistor and the driving thin film transistor, an insulating layer needs to be arranged between the switching thin film transistor and the driving thin film transistor, and the insulating layer extends to the non-display area to form the third inorganic film layer 70.

In some embodiments, the display panel further includes an encapsulation dam 80, the encapsulation dam 80 is disposed between the blocking groove 40 and the drive area 200 and surrounds the drive area 200 and the pixel area 300 along a direction of the light emitting surface of the display panel, such that the drive area 200 and the pixel area 300 are located in an area enclosed by the encapsulation dam 80. In this way, when the material of the encapsulation layer 30 is evaporated, the encapsulation layer 30 may be covered on the encapsulation dam 80.

According to the embodiment, through setting the encapsulation dam 80, it is possible to prevent excess material of the encapsulation layer 30 from being evaporated into an area outside the encapsulation dam 80, and ensure the thickness of the encapsulation layer 30 located in the pixel area 300 and the drive area 200, thereby further reducing the probability of failure of the light-emitting devices in the pixel area 300 caused by external water vapor or oxygen, and prolonging the service life of the display panel.

There may be a plurality of encapsulation dams 80, and the plurality of encapsulation dams 80 may be arranged around the drive area 200 at intervals, so that the thickness of the encapsulation layer 30 located in the drive area 200 and the pixel area 300 can be ensured, thereby ensuring the displaying of the display panel.

It should be understood that the drive area 200 may be used to set a peripheral circuit, and the peripheral circuit is configured to provide a control signal for the light emitting devices and the thin film transistors in the pixel area 300.

In the process of manufacturing the display panel mother board, a substrate with a large size is usually manufactured first, and then a plurality of pixel areas 300 and a plurality of drive areas 200 are formed on the substrate. One pixel area 300 and one drive area 200 form one independent display panel, and the plurality of display panels are arranged at intervals, where the display panels include the array substrate, an OLED layer arranged on the array substrate, and the encapsulation dam 80 arranged on the OLED layer.

When an encapsulation layer 30 needs to be prepared, a mask plate needs to be arranged on the substrate, where openings of the mask plate are used for exposing the pixel area and the drive area, and then the encapsulation layer 30 covering the pixel area and the drive area is formed by, for example, a deposition or sputtering process.

Since there is a gap between the mask plate and the encapsulation dam 80, when the encapsulation layer 30 is formed on the pixel area 300 and the drive area 200, the material of the encapsulation layer overflows to the outside of the encapsulation dam 80 along the gap between the mask plate and the encapsulation dam 80, and is deposited into the blocking groove 40 to form the extension portion 31.

In some embodiments, the encapsulation dam 80 includes insulating layer 81 and support pad 82 stacked with each other, the encapsulation layer 30 covers a top surface of the support pad 82 and side surfaces of the insulating layer 81 and the support pad 82.

In some embodiments, the encapsulation dam 80 includes insulating layer 81 and support pad 82 stacked with each other, the encapsulation layer 30 covers a top surface of the support pad 82 and side surfaces of the insulating layer 81 and the support pad 82.

The insulating layer 81 may be a single film layer, or may be formed by a plurality of stacked film layers. For example, as shown in FIG. 3, the insulating layer 81 includes two sub-insulating layers, a material of one of the sub-insulating layers may be silicon oxide, and a material of the other sub-insulating layer may be silicon nitride.

The insulating layer 81 is further provided with a support pad 82, and the support pad 82 can reduce the abrasion between the insulating layer 81 and the mask plate, and improve the service life of the mask plate.

A second aspect of the embodiments of the present application provides a display device, including the display panel in the above embodiments. The display device can be applied to a smart phone, a tablet computer, a notebook computer, and a mobile terminal or other terminal devices having a display panel.

What is claimed is:

1. A display panel, provided with a pixel area, a drive area and a non-display area, wherein the non-display area surrounds the pixel area and the drive area in a direction parallel to a light emitting surface of the display panel, the display panel comprising:

a substrate and an array substrate, wherein the array substrate comprises a blocking layer, and an encapsulation layer, the substrate, the blocking layer and the encapsulation layer are stacked with each other in the pixel area, the drive area and the non-display area;

wherein the blocking layer is sandwiched between a plurality of inorganic film layers; and at least one blocking groove located in the non-display area, wherein the at least one blocking groove surrounds the pixel area and the drive area in the direction parallel to the light emitting surface of the display panel, and the at least one blocking groove extends at least to the blocking layer in a thickness direction;

wherein the at least one blocking groove extends through the plurality of inorganic film layers; and wherein the encapsulation layer is provided with an extension portion, the extension portion at least covers a surface of the array substrate away from the substrate and a first side surface of the at least one blocking groove close to the drive area, and the encapsulation layer and the blocking layer form a sealed space surrounding the pixel area and the drive area.

2. The display panel according to claim 1, wherein the extension portion further covers a second side surface of the at least one blocking groove away from the drive area, and a bottom of the at least one blocking groove.

3. The display panel according to claim 2, further comprising a first inorganic film layer and a second inorganic film layer, which are located in the non-display area, wherein the first inorganic film layer is arranged on a side of the substrate close to the blocking layer;
the blocking layer is arranged on a side of the first inorganic film layer away from the substrate; and
the second inorganic film layer is disposed on a side of the blocking layer away from the first inorganic film layer.

4. The display panel according to claim 3, wherein the at least one blocking groove passes through the second inorganic film layer in the thickness direction and extends to the blocking layer; or
the at least one blocking groove passes through the second inorganic film layer and the blocking layer in the thickness direction and extends into the first inorganic film layer or to the substrate.

5. The display panel according to claim 4, wherein the first inorganic film layer comprises a plurality of first inorganic film sub-layers stacked with each other, and materials of adjacent first inorganic film sub-layers are different; and the at least one blocking groove extends into any one of the first inorganic film sub-layers in the thickness direction.

6. The display panel according to claim 4, wherein the second inorganic film layer comprises a plurality of second inorganic film sub-layers stacked with each other, and materials of adjacent second inorganic film sub-layers are different.

7. The display panel according to claim 3, wherein a third inorganic film layer is further disposed between the second inorganic film layer and the blocking layer.

8. The display panel according to claim 7, wherein an array substrate is arranged in the pixel area and the drive area, the array substrate comprises a switching transistor and a driving transistor, an insulating layer is arranged between the switching transistor and the driving transistor, and the insulating layer extends to the non-display area to form the third inorganic film layer.

9. The display panel according to claim 8, wherein the blocking layer is formed synchronously with the array substrate.

10. The display panel according to claim 1, wherein a material of the encapsulation layer is different from a material of the blocking layer.

11. The display panel according to claim 10, wherein the material of the encapsulation layer is silicon oxynitride, the material of the blocking layer is silicon nitride, and the encapsulation layer and the blocking layer are connected by N-N bonds.

12. The display panel according to claim 1, wherein when a plane perpendicular to the substrate is taken as a longitudinal section, the longitudinal section of the at least one blocking groove is trapezoidal; and
a size of an opening of the at least one blocking groove is larger than a size of a bottom of the at least one blocking groove.

13. The display panel according to claim 12, wherein the at least one blocking groove comprises a plurality of blocking grooves, and the plurality of blocking grooves are arranged in the non-display area at intervals in a length direction of the display panel.

14. The display panel according to claim 1, further comprising an encapsulation dam, wherein the encapsulation dam is arranged between the at least one blocking groove and the drive area and surrounds the drive area in a direction of the light emitting surface of the display panel, and the encapsulation layer covers the encapsulation dam.

15. The display panel according to claim 14, wherein the encapsulation dam comprises an insulating layer and a support pad stacked with the insulating layer, and the encapsulation layer covers a top surface of the support pad, a side surface of the insulating layer and a side surface of the support pad.

16. A display device, comprising the display panel according to claim 1.

17. The display panel according to claim 1, the at least one blocking groove does not extends in a layer on the side of the array substrate away from the substrate.

* * * * *